(12) United States Patent
Vallat-Sauvain et al.

(10) Patent No.: US 8,846,434 B2
(45) Date of Patent: Sep. 30, 2014

(54) HIGH EFFICIENCY MICROMORPH TANDEM CELLS

(75) Inventors: Evelyne Vallat-Sauvain, Chezard-St. Martin (CH); Daniel Borrello, Cortaillod (CH); Julien Bailat, Gloverier (CH); Johannes Meier, Corcelles (CH); Ulrich Kroll, Corcelles (CH); Stefano Benagli, Neuchatel (CH); Castens Lucie, Neuchatel (CH); Giovanni Monteduro, Colombier (CH); Miguel Marmelo, Couvet (CH); Jochen Hoetzel, Kreuzlingen (CH); Yassine Djeridane, Neuchatel (CH); Jerome Steinhauser, Neuchatel (CH); Jean-Baptiste Orhan, La Chaux-de-Fonds (CH)

(73) Assignee: Tel Solar AG, Trubbach (CH)

( * ) Notice: Subject to any disclaimer, the term of this patent is extended or adjusted under 35 U.S.C. 154(b) by 214 days.

(21) Appl. No.: 13/496,256

(22) PCT Filed: Sep. 17, 2010

(86) PCT No.: PCT/EP2010/063712
§ 371 (c)(1),
(2), (4) Date: Mar. 15, 2012

(87) PCT Pub. No.: WO2011/033071
PCT Pub. Date: Mar. 24, 2011

(65) Prior Publication Data
US 2012/0227799 A1 Sep. 13, 2012

Related U.S. Application Data

(60) Provisional application No. 61/243,646, filed on Sep. 18, 2009, provisional application No. 61/243,689, filed on Sep. 18, 2009, provisional application No. 61/243,628, filed on Sep. 18, 2009, provisional application No. 61/244,224, filed on Sep. 21, 2009.

(51) Int. Cl.
*H01L 31/076* (2012.01)
*H01L 31/18* (2006.01)
*H01L 31/0224* (2006.01)
*H01L 31/0368* (2006.01)
*H01L 31/0376* (2006.01)
*H01L 31/0392* (2006.01)
*H01L 31/052* (2014.01)

(52) U.S. Cl.
CPC ......... *H01L 31/022466* (2013.01); *Y02E 10/52* (2013.01); *Y02E 10/548* (2013.01); *H01L 31/076* (2013.01); *H01L 31/03685* (2013.01); *Y02E 10/545* (2013.01); *H01L 31/03762* (2013.01); *H01L 31/03921* (2013.01); *H01L 31/0527* (2013.01)
USPC ......................................................... 438/69

(58) Field of Classification Search
USPC .................... 438/69; 257/E31.13, E31.126
See application file for complete search history.

(56) References Cited

U.S. PATENT DOCUMENTS 4,292,092 A * 9/1981 Hanak ............................. 438/74
4,633,034 A 12/1986 Nath
(Continued)

OTHER PUBLICATIONS

Meier, et al., "Latest R&D Developments of Thin Film Silicon PV at Oerlikon Solar", The Compiled State-of-the-art of PV Solar Technology and Deployment: 23rd European Photovoltaic Solar Energy Conference, Valencia, Spain, Sep. 2008.
(Continued)

*Primary Examiner* — Long K Tran
*Assistant Examiner* — Jordan Klein
(74) *Attorney, Agent, or Firm* — Pearne & Gordon LLP

(57) ABSTRACT

A method for manufacturing a micromorph tandem cell is disclosed. The micromorph tandem cell comprises a µc-Si:H bottom cell and an a-Si:H top cell, an LPCVD ZnO front contact layer and a ZnO back contact in combination with a white reflector. The method comprises the steps of
 applying an AR—Anti-Reflecting—concept to the micromorph tandem cell;
 implementing an intermediate reflector in the micromorph tandem cell.
The micromorph tandem cell can achieve a stabilized efficiency of 10.6%.

18 Claims, 10 Drawing Sheets

(56) References Cited

U.S. PATENT DOCUMENTS

| | | | |
|---|---|---|---|
| 6,309,906 B1* | 10/2001 | Meier et al. | 438/69 |
| 7,741,144 B2* | 6/2010 | Choi et al. | 438/57 |
| 2002/0117199 A1* | 8/2002 | Oswald | 136/256 |
| 2004/0221887 A1* | 11/2004 | Kondo et al. | 136/255 |
| 2005/0172997 A1* | 8/2005 | Meier et al. | 136/261 |
| 2006/0086386 A1* | 4/2006 | Nakano et al. | 136/255 |
| 2007/0200192 A1* | 8/2007 | Shinohara | 257/448 |
| 2008/0115828 A1 | 5/2008 | Taylor | |
| 2008/0173350 A1* | 7/2008 | Choi et al. | 136/258 |
| 2008/0210303 A1* | 9/2008 | Lu et al. | 136/260 |
| 2009/0101201 A1 | 4/2009 | White | |
| 2009/0229663 A1* | 9/2009 | Appadurai | 136/261 |

OTHER PUBLICATIONS

Haug, et al., "Development of Micromorph Tandem Solar Cells on Flexible Low-cost Plastic Substrates", Solar Energy Materials and Solar Cells, Elsevier Science PUblishers, Amsterdam, NL, vol. 93, No. 6-7, Jun. 1, 2009, pp. 884-887.

International Search Report for PCT/EP2010/063712 dated Apr. 23, 2012.

* cited by examiner

| Cell with intermediate reflector | $V_{oc}$ [mV] | FF [%] | Jsc [mA/cm2] | Efficiency [%] | Mismatch $J_{top}-J_{bot}$ [mA/cm$^2$] |
|---|---|---|---|---|---|
| SnO$_2$ initial | 1406 | 74.58 | 10.75 | 11.27 | 0.57 |
| SnO$_2$ degraded | 1391 | 69.84 | 10.66 | 10.35 | 0.41 |
| ZnO initial | 1383 | 72.58 | 11.15 | 11.19 | 1.23 |
| ZnO degraded | 1357 | 68.8 | 10.89 | 10.17 | 1.08 |

HIGH EFFICIENCY MICROMORPH TANDEM CELLS

FIELD OF THE INVENTION

The present invention relates to silicon-based thin-film solar cells and modules and to their manufacture. It relates to improvements in the manufacturing process for thin-film, silicon-based solar cells or modules. More specifically the invention relates to micromorph thin-film solar cells, in particular to micromorph tandem cells, and to their manufacture.

BACKGROUND ART

Photovoltaic devices, photoelectric conversion devices or solar cells are devices which convert light, especially sunlight into direct current (DC) electrical power. For low-cost mass production thin film solar cells are being of interest since they allow using glass, glass ceramics or other rigid or flexible substrates as a base material (substrate) instead of crystalline or polycrystalline silicon. The solar cell structure, i. e. the layer sequence responsible for or capable of the photovoltaic effect is being deposited in thin layers. This deposition may take place under atmospheric or vacuum conditions. Deposition techniques are widely known in the art, such as PVD, CVD, PECVD, APCVD, . . . all being used in semiconductor technology.

The conversion efficiency of a solar cell is the common measure for the performance of a solar cell and is being determined by the ratio of the output power density (=product of open-circuit voltage $V_{oc}$, fill-factor FF and current-density $J_{sc}$)—to the input power density.

A thin-film solar cell generally includes a first electrode, one or more semiconductor thin-film p-i-n or n-i-p junctions, and a second electrode, which are successively stacked on a substrate. Each p-i-n junction or thin-film photoelectric conversion unit includes an intrinsic or i-type layer sandwiched between a positively doped or p-type layer and a negatively doped or n-type layer. The intrinsic semiconductor layer occupies the most part of the thickness of the thin-film p-i-n junction. Photoelectric conversion occurs primarily in this i-type layer; hence it is also called active or absorber layer.

Depending on the crystallinity of the i-type layer solar cells or photoelectric (conversion) devices are characterized as amorphous (a-Si) or microcrystalline (μc-Si) solar cells, independent of the kind of crystallinity of the adjacent p and n-layers. Microcrystalline layers are being understood, as common in the art, as layers comprising at least a Raman crystallinity of 15% of microcrystalline crystallites in an amorphous matrix.

The doped layers in a p-i-n junction are also often referred to as window layers. Since the light absorbed by the doped p/n layers is lost for the active layer, highly transparent window layers are desired to obtain high current-densities ($J_{sc}$). Furthermore the window layers are instrumental in establishing the electric field in the semiconductor junction constituting the solar cell, which helps collecting the photo-generated charge carriers and obtain high $V_{oc}$ and FF values. Besides this, the contact between the front transparent conductive oxide (TCO) and the window layer should be ohmic with a low resistivity, in order to obtain good FF values. In the art window layers of microcrystalline silicon have been preferred over amorphous window layers due to their better optical properties (less absorption).

Prior Art FIG. 9 shows a basic, simple photovoltaic cell 40 comprising a transparent substrate 41, e. g. glass with a layer of a transparent conductive oxide (TCO) 42 deposited thereon. This layer is also called front contact and acts as first electrode for the photovoltaic element. The combination of substrate 41 and front contact 42 is also known as superstrate. The next layer 43 acts as the active photovoltaic layer and comprises three "sub-layers" forming a p-i-n junction. Said layer 43 comprises hydrogenated microcrystalline, nanocrystalline or amorphous silicon or a combination thereof. Sub-layer 44 (adjacent to TCO front contact 42) is positively doped, the adjacent sub-layer 45 is intrinsic, and the final sub-layer 46 is negatively doped. In an alternative embodiment the layer sequence p-i-n as described can be inverted to n-i-p, then layer 44 is identified as n-layer, layer 45 again as intrinsic, layer 46 as p-layer.

Finally, the cell includes a rear contact layer 47 (also called back contact) which may be made of zinc oxide, tin oxide or ITO and a reflective layer 48. Alternatively a metallic back contact may be realized, which can combine the physical properties of back reflector 48 and back contact 47. For illustrative purposes, arrows indicate impinging light.

It is generally understood that when light, for example, solar radiation, impinges on a photoelectric device electron-hole pairs are generated in the i-layer. The holes from the generated pair are directed towards the p-region and the electrons towards the n-region. The contacts are generally directly or indirectly in contact with the p- and n-regions. Current will flow through an external circuit connecting these contacts as long as light continues to generate electron-hole pairs.

I. GENERAL

High Efficiency Micromorph Tandem Developments in KAI-M PECVD Reactors

This —general— portion of the present patent application is —substantially— taken from U.S. Provisional application Ser. No. 61/244,224 filed Sep. 21, 2009 with the U.S. Patent and Trademark Office. The following mainly concerns micromorph tandem cells with stabilized efficiencies of 10.6% which have been achieved on as-grown LPCVD ZnO front TCO with relative degradation of around 10%. Applying Oerlikon's in-house developed AR concept stabilized tandem cells with 11.0% efficiency have been obtained using microcrystalline bottom cells of just 1.3 μm thicknesses. Implementing an advanced LPCVD ZnO front TCO stabilized tandem cells of 10.6% have been realized at a bottom cell thickness of only 0.8 μm. Implementing intermediate reflectors in Micromorph tandem cell devices reveal reduced optical losses when LPCVD ZnO is applied compared to commercial $SnO_2$.

Details concerning certain aspects of the invention can be taken from the sections II to IV following further below.

I.1 Introduction

In recent years huge investments have been launched for thin film photovoltaic technology based on thin film silicon, CdTe and CIS/CIGS, as these thin film concepts have in principle a much higher cost reduction potential than conventional wafer-based PV [1-3]. The challenge of thin film PV technology for the coming years will be the improvement of module performance towards crystalline technology, leading the path to low-cost photovoltaic electricity generation. While worldwide several thin film lines based on amorphous and microcrystalline silicon have now been built up, the need for higher efficiencies is the major interest beside cost reduction. Therefore, Oerlikon Solar is concentrating with its R&D group to challenge higher device efficiencies. In this portion of the patent application, we report on our most recent results in Micromorph tandems using industrial PECVD KAI equipment and in-house developed LPCVD ZnO as TCO technology. As light-trapping is one of the most important key to improve performance, special care on the development of LPCVD ZnO tailored to Micromorph tandems has been taken. In addition Oerlikon has developed an in-house AR concept that allows further reducing optical losses of light coupling into the absorber.

1.2 Experimental

The heart of Oerlikon Solar's thin film PV technology is the KAI PECVD reactor (Plasma Enhanced Chemical Vapor Deposition). To improve deposition rates for solar device-quality amorphous, and especially microcrystalline silicon [4-6], the flat panel display-type reactors were modified to run at a higher excitation frequency of 40.68 MHz. In this study results were obtained in KAI-M (520×410 mm$^2$) reactors. For more details regarding PECVD processes see previous publications [7] and reference [8].

A special focus in our studies has been the tuning of the LPCVD front ZnO contact layer for optimized Micromorph efficiencies. Therefore, we developed different front TCOs, one that is as-grown, type A, and one, type B, that is modified and adjusted for very efficient light-trapping with high Haze of over 40% (at 600 nm wavelength). In addition an in-house AR (Anti-Reflecting) concept has been developed that allows for further enhanced light coupling into the device. Amorphous silicon top cells have been developed on ZnO as reported [8], leading to new record single-junction devices.

Recently [9] we have shown that applying the intermediate reflector concept based on PECVD processes in combination with commercial SnO$_2$ as front TCO leads to losses in the microcrystalline silicon bottom cell. We will present here a comparison between in-house developed ZnO and commercial SnO$_2$ as front TCO incorporating intermediate reflectors.

ZnO back contacts in combination with a white reflector reveal excellent light-trapping properties and have been systematically applied in all cells presented here. The test cells were laser scribed to areas of well-defined 1 cm$^2$.

In order to evaluate the stabilized performance the tandem cells were light-soaked at 50° C. under 1 sun illumination for 1000 hours. The devices were characterized under AM 1.5 illumination delivered from double-source sun simulators.

Spectral data of transmission and reflection were analyzed by a Perkin-Elmer lambda 950 spectrometer using an integrating sphere.

1.3 Results and Discussion 1.3.1 LPCVD ZnO Front Contacts

The ZnO front contact layers have been developed in our R&D LPCVD reactor system resulting in the optical transmission characteristics as given in FIG. 1. This ZnO film represents type A material, whereas a different type B ZnO is processed to achieve very high Haze of ~40%.

1.3.2 Micromorph Tandem Cells on ZnO Type A Substrates

Micromorph tandem cells have been studied in various ranges of top & bottom cell thickness configurations with respect to the potential of highest stabilized efficiency. FIG. 2 captures the status of the present highest stabilized efficiency on type A ZnO. The relative efficiency degradation of 10% from 11.8% to 10.6% absolute reflects the expected loss due to the involved a-Si:H top cell thickness of 250 nm when comparing with relative SWE degradation of amorphous silicon single-junction cells [8].

In addition we investigated the impact on the Micromorph tandem cell performance when applying the in-house AR concept. Various configurations of Micromorph tandem cells have been prepared including the AR. In FIG. 3 the present highest stabilized test cell efficiency together with its initial characteristics are given. The cell reaches an initial efficiency well above 12% with rather high short-circuit current densities of 12.6 mA/cm$^2$ thanks to a very efficient applied light-trapping. The relative degradation is about 11% and is consistent with the extrapolated degradation rate of the amorphous silicon top cell.

1.3.3 Micromorph Tandem Cells on ZnO Type B Substrates

The effect of the enhanced Haze of ZnO type B is compared with ZnO type A in FIG. 4 by the quantum efficiency (QE) of Micromorph tandem cells with similar top and identical bottom cell thicknesses.

The enhanced light-trapping capability of ZnO B leads to remarkable enhancement in the bottom cell current.

Micromorph tandem cells have been prepared on ZnO B front TCO. Due to the very efficient light-trapping of the µc-Si:H bottom cell, the microcrystalline silicon intrinsic absorber layer thickness could remarkably be reduced. In FIG. 5 the AM1.5 I-V characteristics of a tandem cell with a microcrystalline bottom cell of only 0.8 µm is given in the initial and light-soaked state. The 10.6% stabilized efficiency is a remarkable result as the total silicon absorber layer top & bottom cell is only about 1 µm thick. Regarding manufacturing cost this very thin but remarkably efficient device is a very interesting option.

1.3.4 Development of Intermediate Reflectors in Micromorph Tandems

Intermediate reflectors have been developed in the KAI-M reactors for enhancing the light-trapping in the amorphous silicon top cell. Refractive indexes of down to 1.68 could be achieved for these layers so far [10, 9]. Such intermediate reflectors have been implemented in Micromorph tandems using LPCVD ZnO and SnO$_2$ as front TCO window and analyzed with respect to its spectral reflection properties.

FIGS. 6 and 7 show the overall total reflection of tandem cells with and without intermediate reflectors for SnO$_2$, respectively LPCVD ZnO as front TCOs. Two different intermediate reflectors of 30 nm and 50 nm thicknesses have been studied for SnO$_2$, whereas in case of ZnO an interlayer with 50 nm thickness was implemented.

In FIG. 6 the presence of pronounced interference fringes is typical for commercial substrates like SnO$_2$. The reflection at ~650 nm clearly increases for the cell with 30 nm interlayer and gets even more pronounced when the thickness of the intermediate reflector is further enhanced to 50 nm. In comparison, FIG. 7 reveals the total reflection of cells deposited on LPCVD-ZnO coated glass substrates. The comparison with FIG. 6 indicates directly that the overall reflection characteristics are in case of ZnO reduced by about 2.5%. It has to be noted that in these IR layer studies no AR concept has been applied. In contrast to SnO$_2$ the cell with 50 nm intermediate reflector on ZnO has similar low reflection characteristics as the cell without interlayer and only soft interference fringes are observed. Remarkably, the introduction of the intermediate reflector seems to barely increase the reflection in case of LPCVD ZnO. In FIG. 8 the results of best a-Si:H/µc-Si:H tandem cells with implemented intermediate reflectors are given both for commercial SnO$_2$ as well as in-house developed LPCVD ZnO. The detailed solar cell parameters are summarized in FIG. 8 in the initial and light-soaked state (1000 h).

Up to now, in our laboratory at Neuchâtel the highest stabilized cells with intermediate reflector on commercial SnO$_2$ substrates achieved an initial efficiency of 11.27% that degraded down to 10.35% [10]. For this slightly bottom limited device the current mismatch in the initial state was 0.57 mA/cm$^2$ (last column of FIG. 8). At present for tandems with intermediate reflectors applied on LPCVD ZnO substrates, an initial efficiency of 11.19% has been reached. This tandem consists of similar top and bottom cell thicknesses as in case of highest stabilized cell on $SnO_2$. On these so far not fully optimized devices on LPCVD-ZnO the current mismatch is more than twice (1.23 mA/cm2) than in case of $SnO_2$. Whereas open-circuit voltage and fill factors are slightly lower compared to $SnO_2$, the current is higher for ZnO, both in the initial and light-soaked state. Thus, the cell on LPCVD ZnO reaches an efficiency of 10.17% after full light-soaking that is very close to the 10.35% obtained on $SnO_2$. The small difference is linked to a more pronounced decrease in Voc of 28 mV compared to 15 mV in case of $SnO_2$. The reason for that behavior is not fully understood yet.

I.4 Summary and Conclusions

The inventors have demonstrated in R&D the potential of high efficiency Micromorph tandem cells when applying its in-house developed LPCVD ZnO and the PECVD KAI reactor. Micromorph tandem cells without AR have achieved in an efficiency of 10.6% (initial 11.8%) after full light-soaking on as-grown LPCVD ZnO. Applying our in-house AR concept a Micromorph cell with even 11% stabilized efficiency could be obtained with a microcrystalline bottom cell of only 1.3 μm thickness. These results were obtained by optimizing all different aspects of light management in combination with improved PECVD deposition processes adapted to the developed front ZnO. The front ZnO layer has been improved with respect to transmission, conductivity, surface texture and free carrier absorption and furthermore an in-house AR concept has been developed and applied. On advanced front ZnO for Micromorph tandem a stabilized cell of 10.6% efficiency has been obtained at a μc-Si:H bottom cell thickness of just 0.8 μm!

Applying intermediate reflector in Micromorph tandems reveal a reduced reflection loss for LPCVD ZnO as front contact compared to commercial $SnO_2$ front TCO. Micromorph tandem solar cells with incorporated intermediate reflector show at present stabilized efficiencies of 10.4% on $SnO_2$, respectively 10.2% on LPCVD ZnO.

Up-scaling of Micromorph tandems to industrial size substrate area of 1.4 $m^2$ has led in Oerlikon Solar's pilot line to 151 W initial module power [11, 12]. This corresponds to an module aperture efficiency of 11% (initial). On several sites of Oerlikon's customer Micromorph tandem module ramp-up and production has started. As an example of Oerlikon's equipment performance we refer to the work of Inventux group, see reference [13].

II. SURFACE TREATMENT FOR IMPROVEMENT OF ELECTRICAL PROPERTIES

Method for Manufacturing a Photovoltaic Device with Improved Performance

This portion of the present patent application is —substantially— taken from U.S. Provisional application Ser. No. 61/243,646 filed Sep. 18, 2009 with the U.S. Patent and Trademark Office and relates to improvements in the manufacturing process for thin-film, silicon-based solar cells or modules. More specifically it relates to a manufacturing process for the so called window layer in a thin film silicon solar cell and a layer structure for such thin film silicon solar cell. In particular it relates to a surface treatment for the electrode layer in a solar cell structure, said electrode layer comprising a transparent conductive oxide (TCO).

II.1. Deficiencies in the Art

The window (p/n-type) layers are generally made of amorphous or microcrystalline silicon (also called nanocrystalline) or any mixture thereof and their alloys with oxygen, carbon, germanium, and the like. Since the p/n-type layers are highly defective (disordered) the photogenerated electron-hole pairs recombine with a high probability; thus they do not contribute to the photocurrent of the device but do cause absorption losses. The thickness of the doped layers should for this reason be minimized in order to reduce these optical losses. However, when the doped layer thickness is reduced too much, the values of the fill-factor and the open-circuit voltage drop significantly.

II.2. Summary

It is suggested herein, that prior to the growth of a window layer for a thin film silicon layer stack, a short surface treatment shall be performed resulting in a very thin, continuous or discontinuous nucleation layer or TCO surface preparation respectively. It has shown that such treatment improves the electrical properties of the later cell.

II.3. Detailed Description

Generally, again with reference to FIG. 9, a thin film photovoltaic device photovoltaic cell 40 comprises a substrate 41, preferably a transparent vitreous substrate, usually with a thickness of 0.4 mm to 5 mm, preferably 2 mm to 4 mm, an electrically conductive oxide 42 as contact on the substrate 41, one or more semiconductor layers 43-46, which generate an electric charge separation upon exposure to light, and a second electrically conductive contact 47.

This surface treatment presented herein comprises providing a substrate 41 with a TCO contact layer 42 thereon, providing a plasma of $SiH_4$, $H_2$ and optionally a doping gas (e.g. trimethylboron, diborane, . . . ) in a gas phase concentration between 0 to 80%; preferably 0 to 20% of the concentration used for deposition of the subsequent sub layer 44=p-doped window layer.

In the following example, said surface treatment implemented with parameters as in Table 2, prior to the p-layer, increases the efficiency of the solar cell by 2.09% (Table 3), half of this gain being achieved in the current-density (see EQE in FIG. 10).

TABLE 2

| | $SiH_4$ (sccm) | $H_2$ (sccm) | $TMB/H_2$ (sccm) | $CH_4$ (sccm) | Power (W) | Pressure (mbar) | Freq. (MHz) | Temp. (° C.) | Time (s) |
|---|---|---|---|---|---|---|---|---|---|
| p μc-Si:H | 62 | 1800 | 3.3 | 0 | 400 | 2 | 40.68 | 200 | 70 |
| p a-SiC:H | 50 | 98 | 58 | 95 | 40 | 0.5 | 40.68 | 200 | 35 |
| Surface treatment | 62 | 1800 | 0 | 0 | 400 | 2 | 40.68 | 200 | 5 |
| p μc-Si:H | 62 | 1800 | 3.3 | 0 | 400 | 2 | 40.68 | 200 | 65 |
| p a-SiC:H | 50 | 98 | 58 | 95 | 40 | 0.5 | 40.68 | 200 | 35 |

TABLE 3

|  | Jsc QE (mA/cm$^2$) | Voc (mV) | FF (%) | Efficiency (%) |
|---|---|---|---|---|
| Standard <p> | 16.81 | 903.03 | 70.67 | 10.73 |
| Surface treatment + <p> | 16.98 | 911.00 | 70.80 | 10.95 |
| Relative gain (%) | 1.02 | 0.88 | 0.18 | 2.09 |

Example for standard p-layer, here composed of 2 steps (upper part of Table 2):
1. p μc-Si:H—depositing a p-layer with conditions suitable for microcrystalline silicon material
2. p a-SiC:H—depositing a p-doped layer of an alloy of amorphous silicon and carbon.

A proposed silicon layer stack with a surface treatment comprises 3 steps (lower part of Table 2):
1. Surface treatment: Short exposure (5 seconds) of the TCO layer 42 to a plasma with p μc conditions without doping gas. The plasma conditions are chosen to be the same as in subsequent step 2, but without any dopant gas.
2. p μc-Si:H—Depositing a p-layer under conditions for microcrystalline material for 65 seconds
3. p a-SiC:H—Depositing a p-doped layer of an alloy of amorphous silicon and carbon Table 3 shows absolute values of single junction amorphous solar cells with 'standard p' and inventive 'surface treatment+standard p-layer' and the relative gains.

The example described in Table 2 shall demonstrate results, but shall not be limiting. The processing temperature can be varied between 150 and 280° C. without compromising the gist of the proposal. A frequency between 13.56 MHz and 82 MHz (harmonics of 13.56 MHz) can be successfully employed. For the deposition processes the ratios between SiH$_4$, H$_2$ and dopants (if any) CH$_4$, TMB, PH$_3$ are relevant and can be easily derived from Table 2. The Power applied to the process chamber will influence the desired deposition rate but will also influence the crystallinity of the layer and its stability. Since the cells in this example had the size of 1 cm$^2$, the respective power density per cm$^2$ can be easily derived from Table 2.

The inventive process shall be understood as process for depositing a doped silicon layer on a TCO surface comprising a first plasma treatment process step performed under a first set of process parameters followed by a second plasma deposition process step with essentially the same (first) set of process parameters but including a dopant gas or precursor. For instance, the p-μc layer is deposited with a Silane concentration (SiH$_4$/H$_2$) between 0.1% and 10%, preferably between 1% and 5% with a dopant concentration (dopant/Silane) between 0.01% to 1%, preferably between 0.05% and 0.5% with a power density of 10 mW/cm$^2$ to 1 W/cm$^2$, preferably between 50 and 300 mW/cm2 with a pressure between 0.5 and 12 mbar. The time fraction of the first in relation to duration of first plus second process step shall be between 5 and 20% and/or, in absolute values, between 3 and 15 seconds, preferably between 5 and 10 seconds. The above parameters are typical for a KAI-M PECVD reactor operated at 40 MHZ with an electrode surface of approx. 3000 cm$^2$.

This manufacturing process can be upscaled in a KAI 1200 or similar industrial reactor as commercially available from Oerlikon Solar. The TCO (ZnO) layer can be deposited on a system known as TCO 1200, also from Oerlikon Solar.

The inventive method can be applied in a beneficial manner on all kinds of thin film silicon photovoltaic layer stacks, where a doped window layer has to be deposited on a TCO front contact. The silicon photovoltaic layer stack may be single junction amorphous, tandem junction micromorph, tandem junction amorphous or alike.

III. DART—DIFFUSIVE ANTI-REFLECTIVE TREATMENT

Method for Manufacturing a Photovoltaic Device by Means of Improvements to the Carrier Substrate This portion of the present patent application is —substantially— taken from U.S. Provisional application Ser. No. 61/243,689 filed Sep. 18, 2009 with the U.S. Patent and Trademark Office and relates to improvements in the manufacturing process for thin-film, silicon-based solar cells or modules. More specifically it relates to a treatment process for the substrate or superstrate of a thin film silicon solar cell.

III. 1. Deficiencies in the Art

It is a continuous effort in the art to improve cell efficiency and at the same time reduce manufacturing cost. This balance is difficult to keep.

In order to improve a photovoltaic (PV) device's electrical conversion efficiency, as much as possible of the impinging light shall be able to be absorbed within the active silicon layers. This is achieved by 1) minimizing reflectance losses and 2) introducing light-scattering optical interfaces in the vicinity of the photovoltaic active silicon layers.

The first optical interface producing light intensity losses in the superstrate p-i-n configuration is the air/glass interface 49 (FIG. 9). In order to prevent the typical 4% losses due to reflection of light at this interface, two main technologies are known: antireflection thin film coatings (ARC) or antireflection etching (chemical, plasma or mechanical).

In order to obtain light-scattering at optical interfaces, commonly rough interfaces are being used, mostly the TCO/Si interfaces, which are located in FIG. 9 between references 42 (front contact) and 44 and 46 and 47 (back contact). However, strong light-scattering requires very rough TCOs which render subsequent dense silicon growth and laser patterning of the device much more difficult.

Therefore, it is tempting to introduce rough air/glass and/or rough glass/TCO interfaces by using textured glasses. However, the use of initially textured glasses is expensive and creates problems with the essential processing step of "laser patterning".

Typically, thin-film silicon solar cells pin deposited on flat AR-coated glasses exhibit an increased photocurrent of 3 to 4% which contributes directly to increased cell efficiency. However, the cost for a commercially available dielectric AR-coating in the visible-near IR range (broadband) is quite high. Therefore, AR-coated glasses are used specifically for high-efficiency (record) cell fabrication.

The second known technology for the production of antireflection glasses, namely antireflection etching, has not been used until now in the fabrication of thin-film solar cells, to the authors' knowledge. This is amazing, since further etching of the glass can additionally result in light-scattering at the first air/glass interface. However, this effect has probably not been exploited due to the additional difficulty for laser structuring of the cells deposited on initially textured glasses. Indeed, the patterning laser beam entering the device from the glass-side experiences this light-scattering effect as well, and hence, the focused intensity needed for defined material ablation is partially lost. This makes laser scribing of cells and modules much more difficult on light-scattering glasses. As monolithic series connection is a key element of thin film silicon photovoltaics, compared to conventional wafer based technology, no much attention has so far been paid to the application of light-scattering glass substrates.

Therefore, a "post-cell glass treatment" is proposed which allows to decouple the introduction of 1) optical anti-reflection and 2) light scattering at the air/glass interface. It is thus possible to tailor a Diffusive Anti-Reflective Treatment (DART) to various thin-film solar cell configurations, depending on the amount of optical diffusion wanted for maximal device performances.

III.2. Summary

It is suggested, to structure or texture the air/glass interface 49 after full cell or module preparation. The glass is exposed to an etching treatment that does not destroy the solar cell (or fully laser patterned module) fabricated on the other (averted) side. This etching DART treatment preferably is being performed by RIE (Reactive Ion Etching) plasma etching but is not limited to this process. Microwave plasma etching, mechanical or chemical glass etching can be used as well, depending on the glass composition. An etching DART treatment for 5-15 minutes under conditions described below has shown to provide for antireflective effects, an inventive treatment up to 2 hrs will additionally provide for increased light scattering properties.

III.3. Detailed Description

It has been found that a plasma treatment in a RIE reactor with a mixture of $O_2$ and $SF_6$ (gas flux ratio of $SF_6$:$O_2$=5:1, pressure 30 mTorr, power 600-1000 W, preferably longer than 5 min) is appropriate for etching Schott Borofloat 33 glass.

In order to avoid damaging of the cell stack, protective measures need to be taken. As known in the art the silicon layer stack 43 and the rear contact layer 47 (cf. FIG. 9) and sometimes reflective layer 48 are being deposited by vacuum or near vacuum process steps such as PECVD, LPCVD, PVD. If the DART process shall be used at this stage of the manufacturing process, the sensitive layer stack has to be protected from the effects of the frontside etching process. This can be done e. g. by temporary mechanical means, such as a carrier arrangement with a clamping frame, whereat the frame provides for sealing means that allow to exposing only those portions of the front side of substrate 41 that need to be DART processed. Alternatively a removable adhesive film or a removable paint can be used. The inventors have found that surprisingly the well-known white paint reflector (feature 48) is also a sufficient protection against the exposure of the etching step. Since the diffuse white paint reflector has to be applied in a later step of the module assembly process anyway, essentially no additional means are necessary. Fore very extended DART treatment the white paint may change its properties, because of the heat generated by the treatment or/and the chemical gasses employed in the DART treatment. Hence, for long treatments and/or treatments which can generate a heating up of the sample, it is preferably to process the DART before the white paint application or to provide for sufficient cooling in order to avoid detrimental effects.

FIG. 11 shows the measured total reflection coefficient of a series of glass/TCO/a-Si:H pin/TCO structures. At near-specular light incidence, there are 7-6% reflection losses at the air/plain glass (Schott Boroflaot33) interface. The total reflection is decreased to $R_{totARCglass}$≈3% by using a typical commercial (Schott) broad-band AR-coating in the range 400-650 nm. This corresponds to a decreased reflection $R_{totflatglass}$−$R_{totARCglass}$=4%. An inventive Diffusive Anti-Reflection Treatment (DART) of at least 15 min allows obtaining similar $R_{tot}$ as the expensive AR-coating. The corresponding gain in the light intensity entering the device is completely transferred in a relative gain of 3.5-4% in the photocurrent ($J_{SC}$) of the thin film device.

It can be noted in FIG. 11 that the AR-coating reflection losses exhibit some wavelength-dependency (interference fringes) in the range between 400-650 nm, which is different from the flat glass configuration. This is due to the fact that the ARC effect relies on interferences within dielectric thin-film stacks. However, the amplitude of the fringes is visibly decreased for the DART glasses.

This is experimental evidence that some optical diffusion effect must occur at the air/DART interface. This is seen by observation of the treated glass surface morphology whose roughness and morphology evolves with etching times (see FIG. 11). Therefore, the DART treatment can be tailored to produce anti-reflection effect only (short treatment time) or anti-reflection+light-scattering effects (longer glass treatment time).

FIG. 12: 5 minutes plasma treatment, FIG. 13: 120 min plasma treatment.

Figure 1:
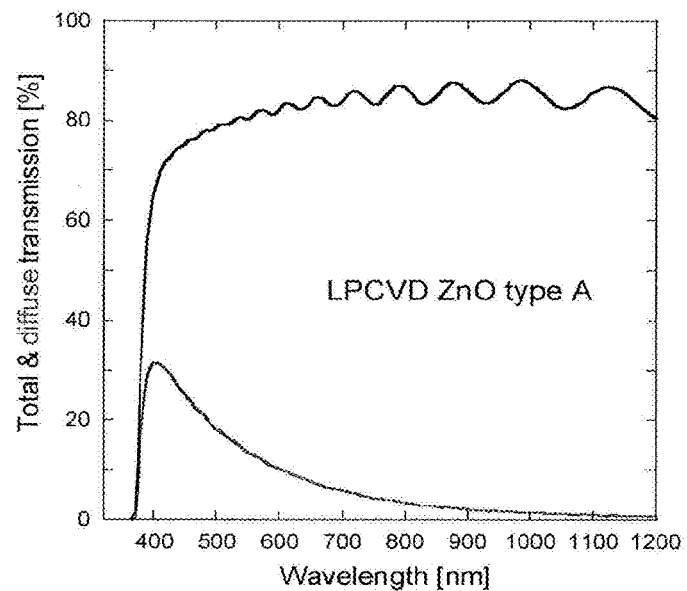

This is an advantage, by which the absorption of incoming light in the silicon layers can be further maximized. Therefore, the diffuse component of the DART can be tailored to the front TCO optical scattering characteristics and to the device thickness (tandem- or single-junction). For example, if the DART of the glass increases the light-scattering of long-wavelength light (>700 nm), then the microcrystalline bottom cell can be kept thinner for current matching with the top cell.

This effect can be obtained with longer etching times of the glass. It allows for an increased light-scattering in the long wavelength range, a property difficult to obtain from the as-grown textured ZnO developed for a-Si:H cells.

Typically, the optimum etching process of the glass for a micromorph solar cell deposited on a rather flat ZnO is longer, as it is needed to have increased light-scattering for the microcrystalline silicon bottom cell. The optimum etching time will depend as-well on the presence of an intermediate reflector within the tandem micromorph. Finally, it has been observed that special combination of DART with a Micromorph solar cell is not limited to an increased $J_{SC}$, but can lead as well to an increased $V_{OC}$ and FF.

All these examples indicate that DART allows an optimized tailoring for maximum efficiency of almost any combination of TCO/a-Si:H/μc-Si:H/TCO layer thicknesses combinations.

The application of the above-proposed, which has been used for very high efficiency test cells, can also be applied to industrial thin-film a-Si:H silicon modules, if its cost is not prohibitive compared to an expected 3.5-4% module power increase. The angular dependency of the reflection coefficient is very small; i.e. the reflection losses are reduced even for light incidence angles far from near-specular. Thus, not only higher efficiencies can be achieved by DART, but as well the yearly energy production (kWh/kW$_p$) of modules in real outdoor applications will be positively affected due to the weak angular dependency of the DART characteristics. Known Broadband AR-thin film coatings can also be optimized for minimal angular dependency, but this is an additional, constraining requirement for the optimization of such a coating.

This has the potential for an increased micromorph tandem solar cell efficiency and an enhanced light-trapping capability for a further reduction of the Si absorber (until now, 10% gain in photocurrent of the bottom cell, in some cases increased Voc and FF) by optimal combination of front glass/TCO/Si/TCO device system. It is being understood, that the values given above are depending on many parameters and that a general recipe cannot easily be given. The exposure time to an inventive DART treatment depends on the capabilities of the etching machine, the type of glass (thickness, chemical composition), the used front and back contact (in particular their Haze factor), the technology (aSi or Micromorph), for each technology the absorber layer thickness used for the cell, use or not of a intermediate reflector, and—last but not least whether only a antireflective effect shall be attained (short etching) or a diffusion PLUS antireflection (long etching time). The man skilled in the art, will, following the basic teaching above, adopt the necessary changes to comparable process environments.

IV. CONTROLLED AND ACCELERATED OXIDATION BEFORE BACK CONTACT TCO DEPOSITION

Method for Manufacturing Thin Film Silicon Photovoltaic Device by Means of a Fast Oxydizing Treatment to Improve Yield and Electrical Performance This portion of the present patent application is —substantially—taken from U.S. Provisional application Ser. No. 61/243,628 filed Sep. 18, 2009 with the U.S. Patent and Trademark Office and relates to a method of fabricating thin film solar cells. It focuses on a treatment allowing to reducing the leakage current of such thin film solar cells. In particular it relates to an oxidizing surface treatment of a thin film silicon layer or multilayer structure forming part of a thin film solar cell by oxidation of the surface of the last deposited silicon.

Figure 15:
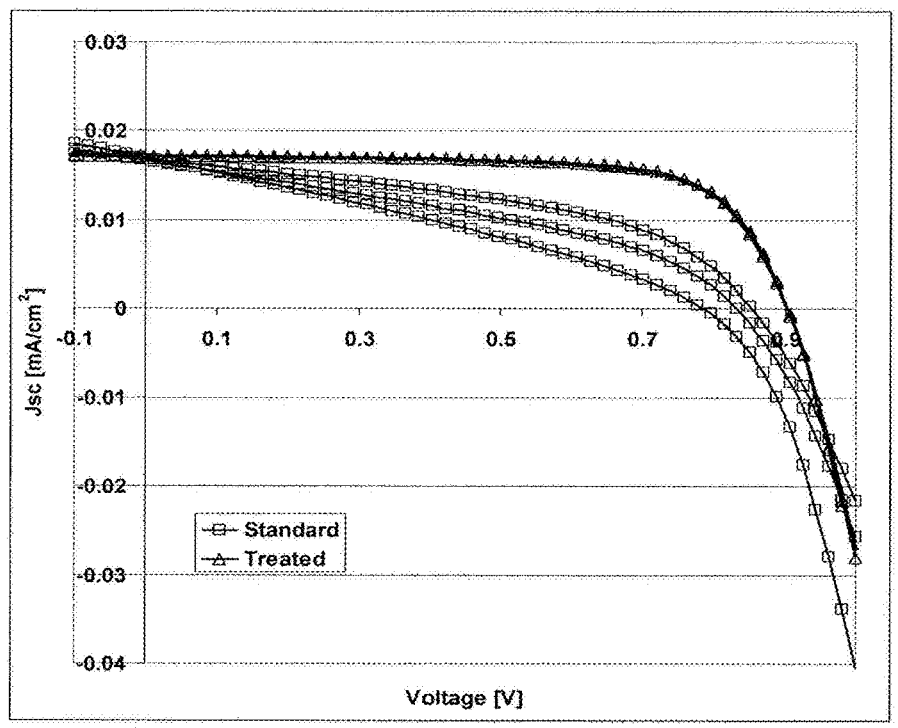

For evaluation of the yield, the open-circuit voltage $V_{OC}$ of the cells is measured (after back contact deposition and cell patterning) under a low light intensity (intensity lower than 10% of AM1.5). Under these measurement conditions, cells exhibiting an open-circuit voltage lower than 600 mV are considered as (partially) shunted and will exhibit poor electrical performances under AM1.5 full illumination. FIG. 15 shows the standard AM1.5 I(V) curves of three contacted test cells exhibiting a low-illumination Voc below 600 mV (i.e. so-called partially shunted) and the I(V) curve of one test cell of the same pin PECVD run oxidized before back contact deposition (i.e. passivated device according to what has been propsed above).

There are several possible origins to shunts in thin-film silicon solar cells. For example, particles on the front contact are highly detrimental for high yield. But if particles are the cause of the shunted behaviour of the device, their effect can be cancelled notably by using an intrinsically started back contact as described in publication WO 2009/077605.

Figure 16:
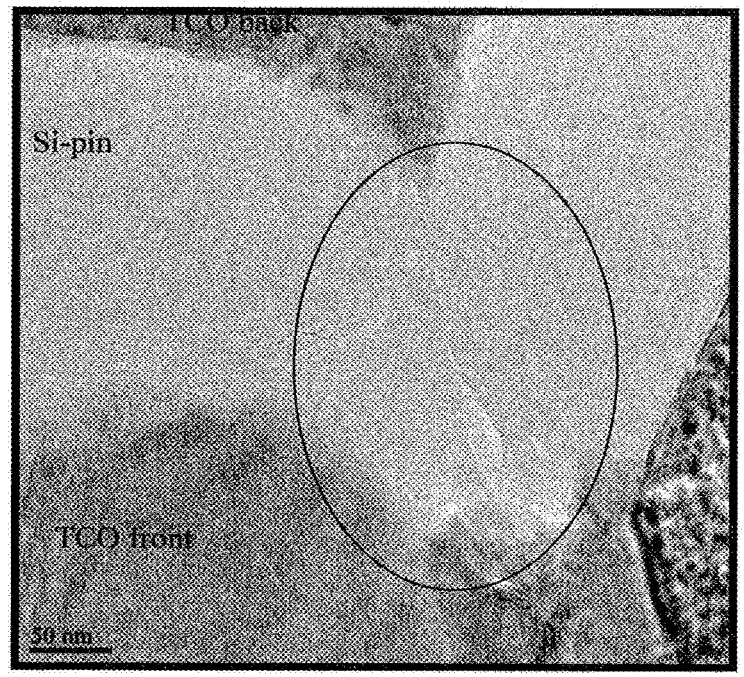

Another cause of low yield and poor electrical performances in thin-film silicon solar cells is the presence of low-density, low-quality silicon material observed in devices fabricated on rough substrates, see FIG. 16. The detrimental effect of such defective zones in thin-film silicon deposited on very rough substrates has been described in Sakai et al, J. of Non-Cryst. Solids 115 (1989) p. 198-200 for a-Si:H cells and in M. Python et al. Solar Energy Materials and Solar Cells 93, Issue 10 (2009) p. 1714-1720 for microcrystalline silicon solar cells.

FIG. 16 shows a Transmission electron micrograph of a cross-section of a a-Si:H pin solar cell deposited by PECVD on a rough glass/TCO superstrate (bottom of the micrograph). The circled zone shows the presence of low-density, porous silicon material. The TEM micrograph is the projected view of a 2D "leaking boundary" present in the 3D layer stack. Such boundaries are observed over recessed areas of the substrate. Such low density material deteriorates the overall device electrical performances and is thus suspected to be highly electronically defective.

It is known that high yield is difficult to obtain for very thin pin devices (i-layer thickness below 200 nm, p-layer thickness below 10 nm) or on pin devices deposited on highly textured front contacts (very rough TCOs or glass/TCO superstrates with surfaces possessing acute recessing angles). In these cases, cells are partially or totally shunted if the back contact is directly deposited after PECVD n-layer deposition.

However, we have observed that storage of the incomplete device (i.e. after n-layer PECVD deposition and before back contact deposition) in air during a period of a few days increases the yield and the conversion efficiency of the (later) complete device.

Figure 17:
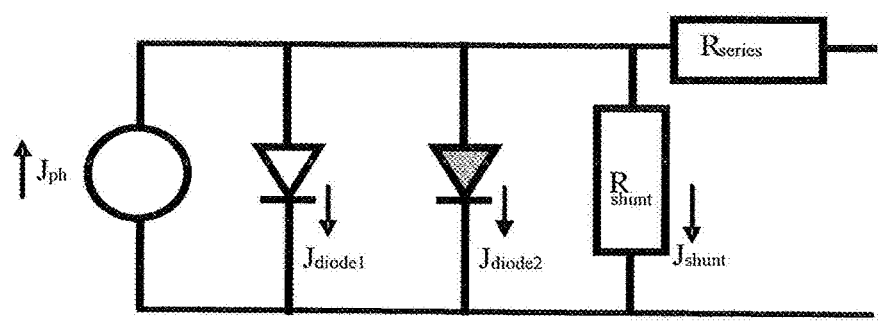

These defective boundaries have been identified as current leaking boundaries. These low density defective material zones can either occur during layer growth within the PECVD reactor or during layer unloading (from deposition temperature (~200° C.) to ambient temperatures) out of the PECVD reactor (weak points for mechanical stress relaxation). Their detrimental impact on the device electrical properties is to increase the dark leakage current proportionally to their linear density as measured in cross-section views (for microcrystalline silicon: ref. Martin Python et al. Solar Energy Materials and Solar Cells Volume 93, Issue 10, October 2009, Pages 1714-1720), according to the equivalent electrical circuit sketched in FIG. 17. FIG. 17 shows a simple equivalent electrical circuit for a thin-film silicon solar cell on a rough substrate exhibiting leaking boundaries. These leaking boundaries are sketched as a second diode in this representation with a "high dark current J diode2".

Figure 18:
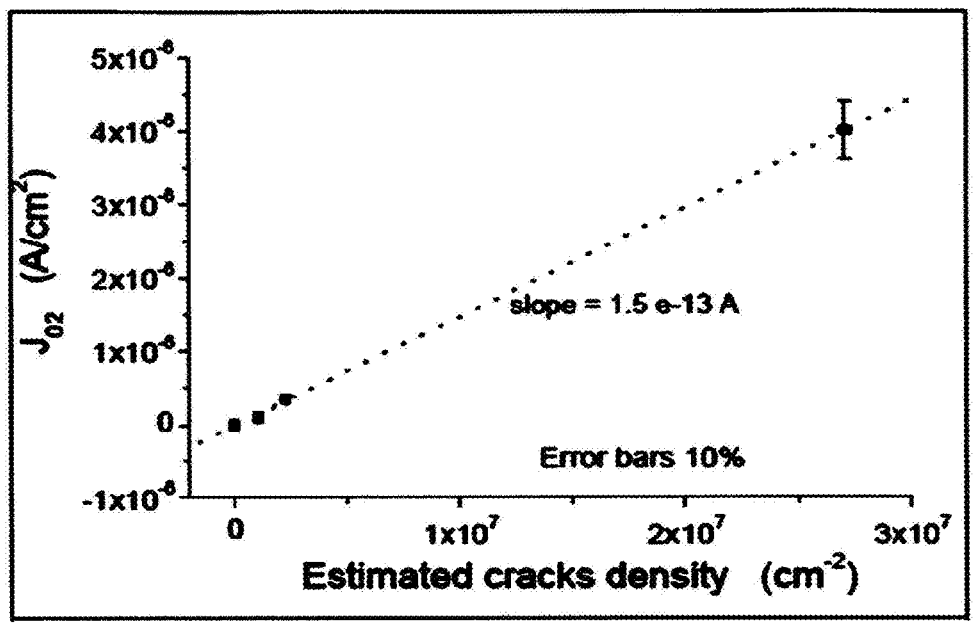

FIG. 18 shows the effect of the leaking boundaries density (called "cracks" in this example) on the dark current density $J_{02}$ of microcrystalline silicon solar cells. From M. Python, PhD dissertation, Institute of Microtechnology, University of Neuchâtel, 2009. Original Caption: Relationship between the $J_{02}$ and the crack density, for p-i-n configuration, estimated by TEM micrographs, in co-deposited mc-Si:H cells on varying substrates. Low $J_{02}$ and low crack-density is observed in high efficiency solar cells.

For given PECVD deposition conditions, the linear density of defective boundaries as observed in a section view depends on the superstrate morphology; and for a given superstrate morphology, PECVD deposition conditions can be found which decrease the density of these defective, leaking boundaries. What is described below allows to deactivate these leaking boundaries in such a way as to notably improve the device electrical properties and the yield.

IV.1. Deficiencies in the Art

The effect of storage in air after the n-layer deposition for increased yield occurs very slowly. About 10 hours of storage in air are needed for high yield on rather flat, standard front contacts, whereas one week storage is needed for high yield on highly textured TCOs or for critical, thin pin devices.

IV.2. Summary

It is suggested, to provide for a controlled and accelerated oxidation of the silicon layer stack of a thin film solar cell before deposition of a back contact TCO.

In a first embodiment a respective silicon surface is exposed to an atmosphere enriched with $H_2O$ and/or 30% $H_2O_2$ for about 1 hour, preferably 1-2 hours at a temperature of 100° C. Increasing the temperature will allow to reduce exposure time. In a second embodiment the silicon surface shall be exposed to ozone at room temperature for about 1 hour. In a variation of this embodiment temperature is set to about 100° C. to accelerate the oxidation process with ozone. An exposition to this environment between 5 to 15 minutes has been found to be effective. In a further variation the surrounding pressure has been set to 0.5 mbar for 15 minutes. Higher ozone concentration allows further reducing the treatment duration. In a third embodiment a soft oxidizing plasma (e.g.: $C_2F_6$, $CO_2$, $O_2$, $SF_6$) after the n-layer deposition is being used. Preferably, the soft oxygen plasma (power 100 W (on 3000 cm$^2$ electrode area), temperature 200° C.) shall be applied for a few seconds, preferably longer than 10 s. A treatment more than one minute has been found not to be beneficial. Changing the effective power and substrate temperature will allow to vary the exposure time without leaving the scope of the proposition.

IV.3. Detailed Description

What is described described herein refers to treatments after the n-layer deposition, but before application of a back contact, which are faster than the air-storage process and allowing to obtain sufficient yield even for thin pin devices (⅓ thinner p-layers, i-layer thickness<200 nm) or for standard thickness pin (i-layer thickness>200 nm) deposited on very rough superstrates (e.g. ZnO RMS>100 nm). After the oxidation treatment, the electrical performances of the device are improved (mostly open-circuit voltage and Fill-Factor, as seen in FIG. 15) These treatments comprise a combination of oxidizing chemical agents with temperature and pressure that allows for an oxidation process occurring otherwise very slowly during ambient air exposure. Evidently, in a respective embodiment all these treatments could also be plasma assisted.

Herein, the oxidation reaction is understood as in classical chemistry i.e. as a typical redox reaction in which there is a transfer of electron from one substance to another. The oxidizing agent is here the substance which accepts electrons. Thus the oxidizing agent is not limited to oxygen. For example fluorine, sulphur, chlorine, nitrogen etc. are chemical oxidizing agents of silicon, even if some of them are not preferentially used because of their detrimental effect as doping elements in silicon.

Several possibilities to speed up the oxidation process have been investigated. The typical faster treatments need less than one hour, preferably less or equal to 5 minutes.

For these embodiments, standard state of the art a-Si:H pin layer stacks (i-layer thickness 240 nm, initial efficiency>11%) have been used. Several oxidation procedures have been evaluated. After n-layer deposition, it has been observed that 1) Exposure of the pin device to humid air ("Becher" glass containing deionised $H_2O$ or $H_2O_2$, with a concentration of 30%) at 100° C. in an oven during 1 hr, preferably 2 hrs allows to increase the yield on critical TCOs from 0 to approx. 80% and the treated cells exhibit good I(V) characteristics.

2) Exposure of the pin device to ozone ($O_3$) obtained from air provided by a commercially available ozone generator during 1 hr or more at room temperature (and 1 atm) in an oven allows to obtain high yield and good I(V) characteristics on highly textured TCO. A temperature increase up to 100° C. accelerates the oxidation process with ozone. There are combinations of temperature and exposure times which give an optimum yield depending on the front TCO roughness/texture: Ozone treatment in an oven at 100° C. during 5 min on a standard ZnO (called "flat" in the caption of FIG. 19) improves notably the yield, whereas a treatment of preferably 15 min is needed for high yield on a highly textured ZnO (called "rough" in caption of FIG. 16). Longer exposure times may not be so efficient. Exposure to $O_3$ during 15 min with sample temperature of 100° C. or more and vacuum of 0.5 mbar (such as in the ZnO-LPCVD equipment, before back contact deposition) is another possibility for ozone oxidation in-between n-layer and back contact deposition. Oxidation times even shorter than 5 min are possible by using a higher ozone concentration in the oxidation chamber (for example by using pure Oxygen for ozone generation).

3) An alternative to ozone exposure is to apply a soft oxidizing plasma (e.g.: $C_2F_6$, $CO_2$, $O_2$, $SF_6$) after the n-layer deposition. Preferably, in a commercial PECVD system like a Oerlikon Solar KAI a soft oxygen plasma (power 300 mW/cm2, temperature 200° C.) during a few seconds, (preferably longer than 10 s) results in high yield on critical TCO and improved cell performances on standard ZnO.

Figure 19:
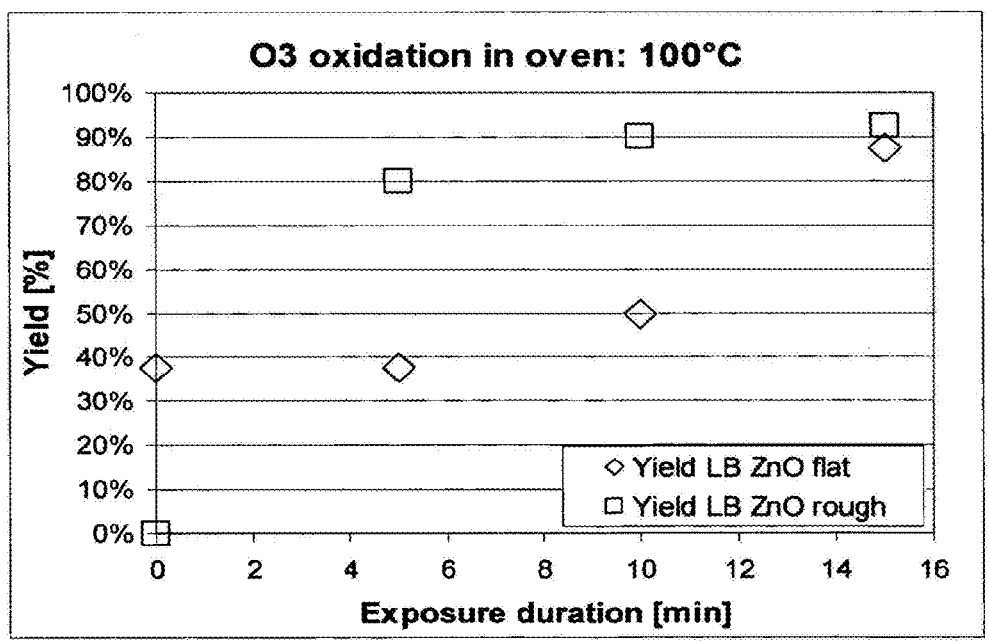

FIG. 19 shows the effect of ozone exposure time on the yield of pin devices with two different TCO front types. Some improvement occurs already after 5 min, the preferred duration is around 15 min.

The proposed fast oxidation process gives an increased conversion efficiency of cells fabricated on standard TCOs. Moreover, it allows to use a larger variety of front TCO/glass combinations in particular those with increased roughness and increased light scattering properties.

Very thin (i-layer thickness lower than 100 nm) a-Si:H pin's with good I(V) characteristics can be successfully realized and finally can be implemented in a-Si:H pin-pin tandem cells, which opens a new potential for stabilized high efficiency a-Si:H based cells and rough TCOs.

Such oxidizing treatments could be as well be applied for deactivation of leaking boundaries in microcrystalline single junction cells and in micromorph cells.

V. BRIEF DESCRIPTION OF THE DRAWINGS

Above, the invention has been described in detail by means of examples and the included drawings. The figures show:

FIG. 1: Total (upper curve) and (lower curve) diffuse transmission of LPCVD ZnO of type A on a Schott Borofloat 33 glass substrate. The ZnO is as-grown and applied in our Micromorph devices. Note the Haze of type A ZnO is about 12%.

Figure 2:
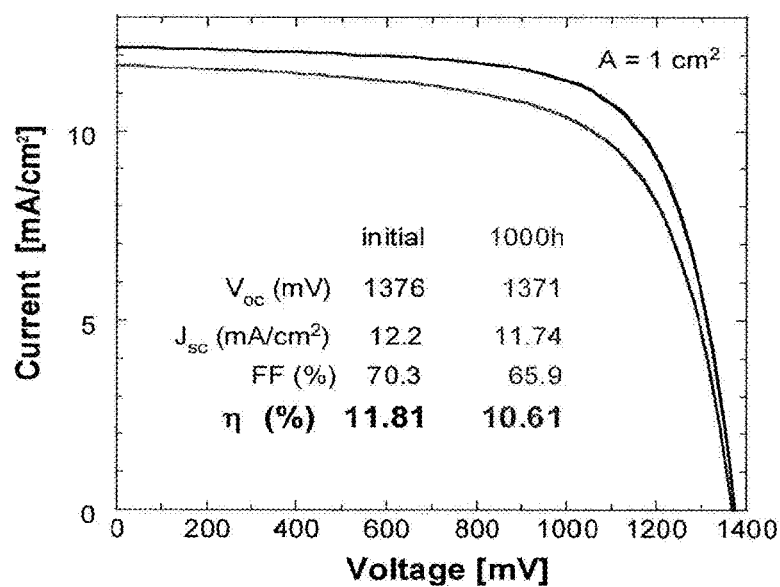

FIG. 2: AM1.5 I-V characteristics of Micromorph tandem cells developed on type A ZnO in the initial (upper curve) and light-soaked state (1000 h, 1 sun, 50° C., lower curve). The µc-Si:H bottom cell has thickness below 2 µm. No AR concept is applied to this device.

Figure 3:
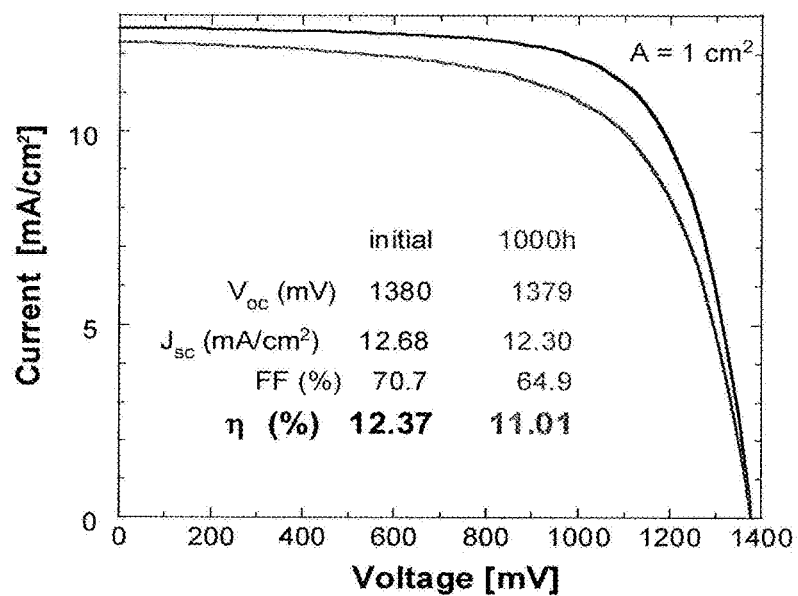

FIG. 3: Micromorph tandem cells AM1.5 characteristics developed on type A ZnO in the initial (upper curve) and light-soaked state (1000 h, 1 sun, 50° C., lower curve) applying our AR concept. It has to be noted that the µc-Si:H bottom cell has thickness of only 1.3 µm.

Figure 4:
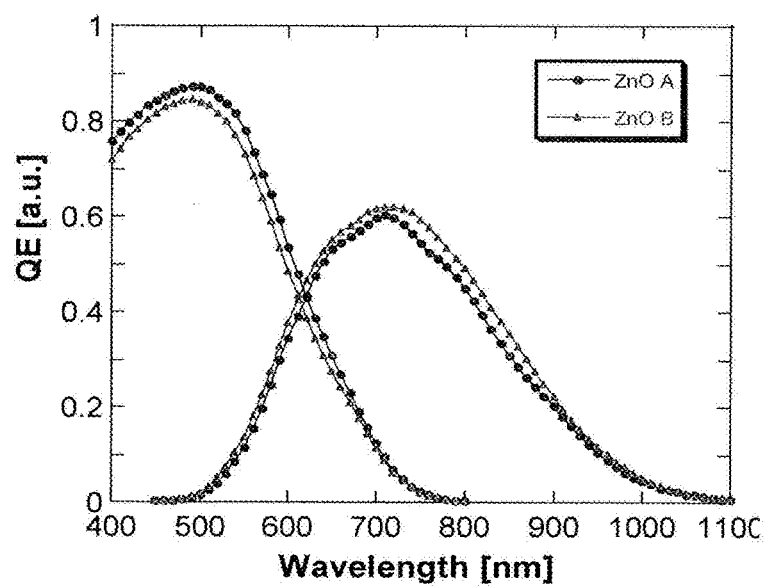

FIG. 4: QE of Micromorph tandem cells on type A & B front ZnOs. The bottom cells have a thickness of 1.2 µm, top cells have comparable thicknesses.

Figure 5:
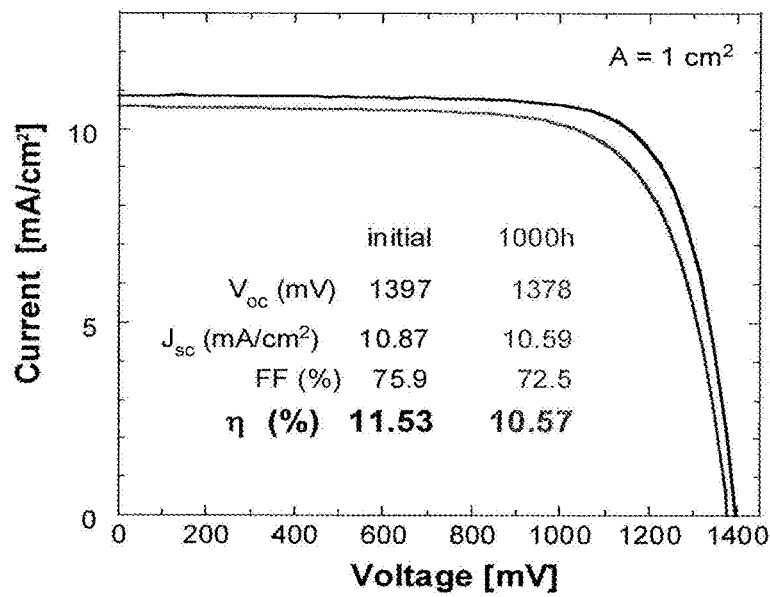

FIG. 5: Micromorph tandem cell in the initial and light-soaked state on type B front ZnO with μc-Si:H layer thickness of only 0.8 μm. The relative degradation is only 8.3%, whereas the stabilized efficiency reaches comparable level as on standard process in FIG. 2, but at much thinner microcrystalline absorber layer.

Figure 6:
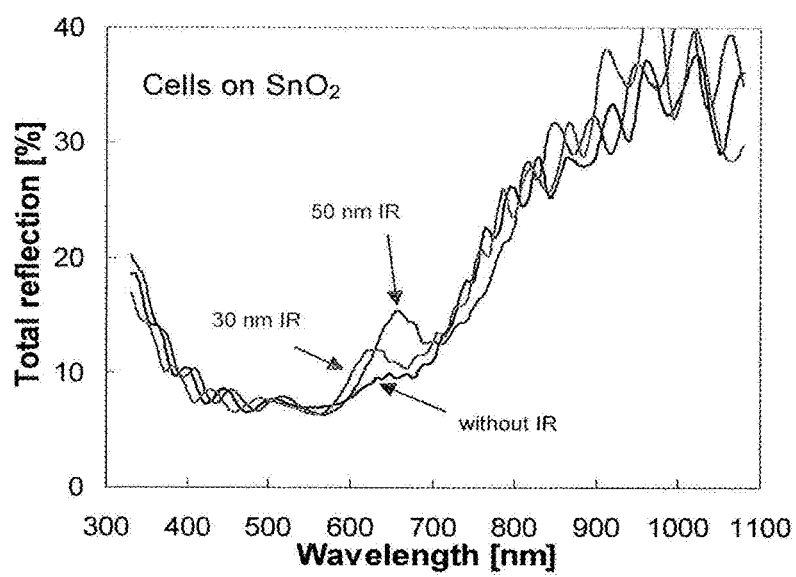

FIG. 6: Total reflection spectra (specular & diffuse) of Micromorph tandem cells deposited on a commercial $SnO_2$. The three spectra present cells without reflector (IR) (blue), with an intermediate reflector of 30 nm (green) and with a reflector of 50 nm (red). Note, the loss of light at ~650 nm wavelength increases with the thickness of the intermediate reflector incorporated compared to the cell without reflector.

Figures 7, 8:
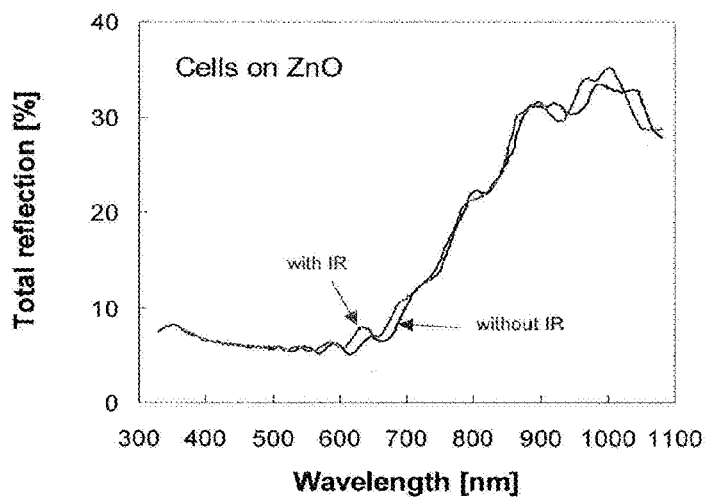

FIG. 7: Total reflection spectra of Micromorph tandem cells deposited on in-house LPCVD-ZnO (higher Haze than $SnO_2$). The two spectra represent cells without intermediate reflector (blue) and with a reflector of 50 nm (red). The cell with intermediate reflector does not reveal a clear peak of reflection losses as can be observed on commercial $SnO_2$.

FIG. 8: Initial and degraded characteristics of tandem cells with intermediate reflector deposited on commercial $SnO_2$ and on ZnO.

Figure 9:
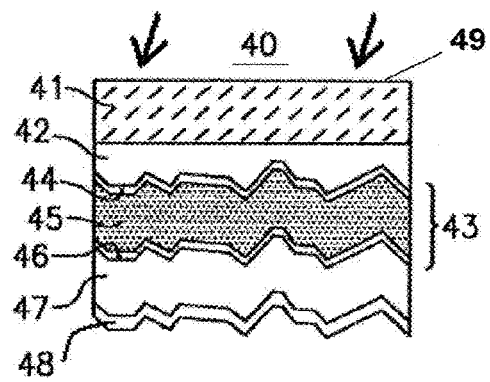

FIG. 9: A basic, simple photovoltaic cell.

Figure 10:
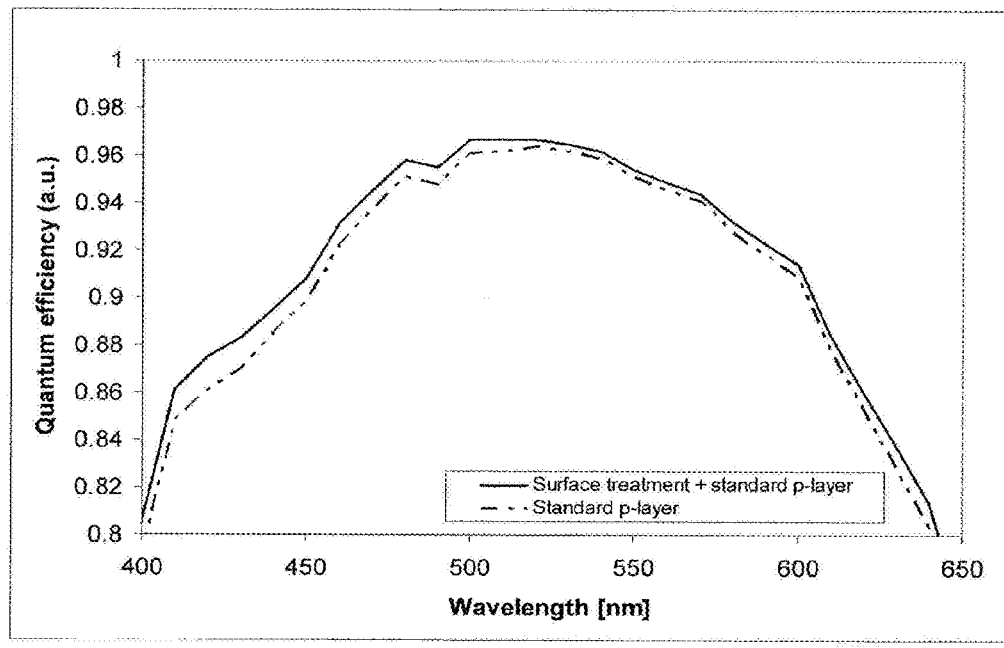

FIG. 10: External Quantum Efficiency (EQE) data.

Figure 11:
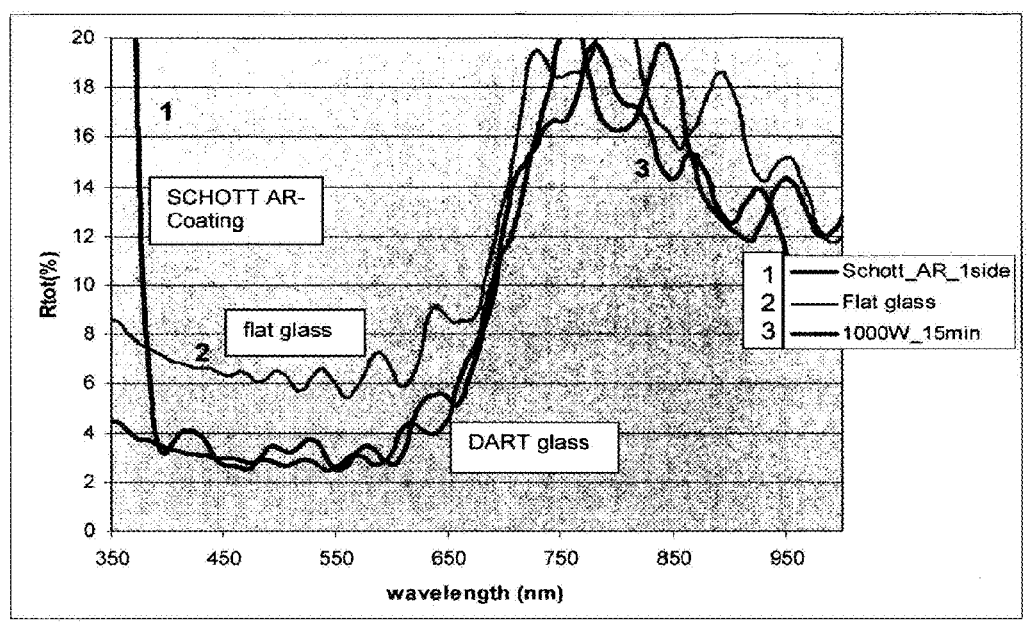

FIG. 11: Measured total reflection coefficient of a series of glass/TCO/a-Si:H pin/TCO structures.

Figure 12:
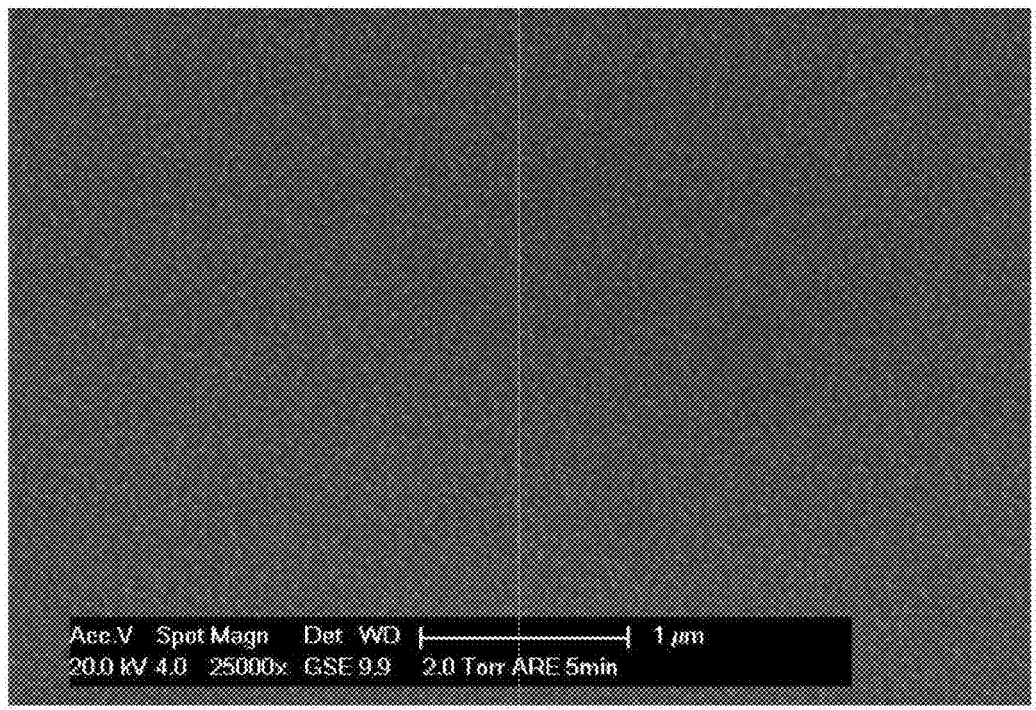
FIGS. 12 and 13 show a scanning electron micrograph of the treated surface of a Schott Borofloat33 glass etched with varying times (RIE reactor with a mixture of $O_2$ and $SF_6$ (glass flux ratio $SF_6$/$O_2$=1.67), pressure 5 mTorr and discharge power of 1000 W)

FIG. 12: Scanning electron micrograph of the treated surface of a Schott Borofloat33 glass, etched (5 minutes plasma treatment).

Figure 13:
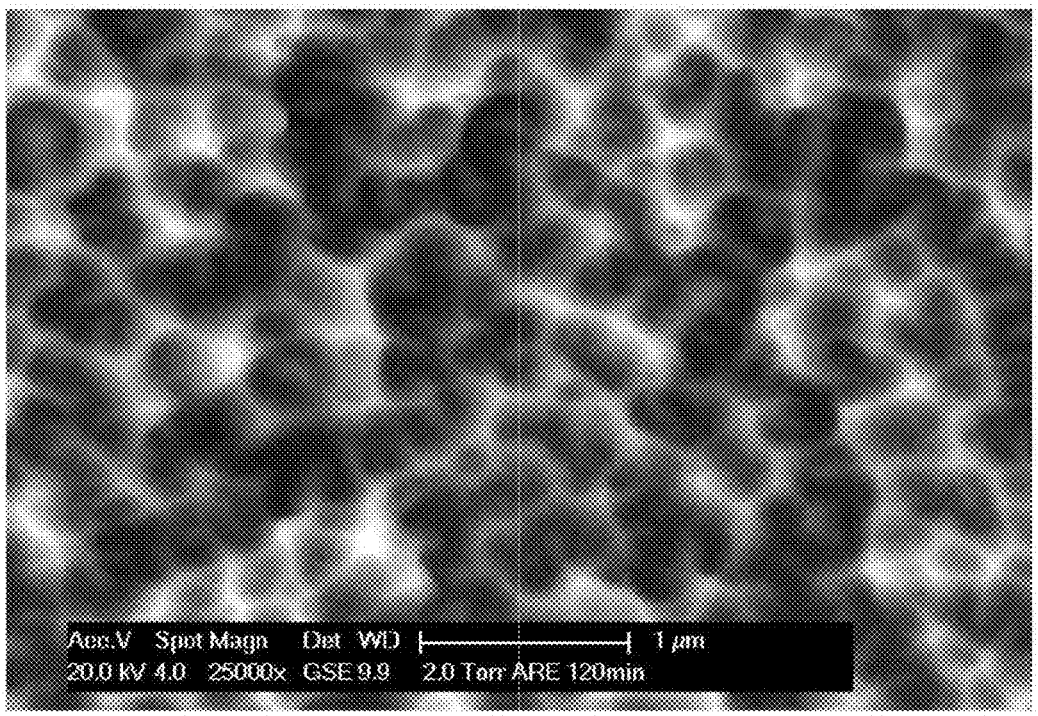

FIG. 13: Scanning electron micrograph of the treated surface of a Schott Borofloat33 glass, etched (120 minutes plasma treatment).

Figure 14:
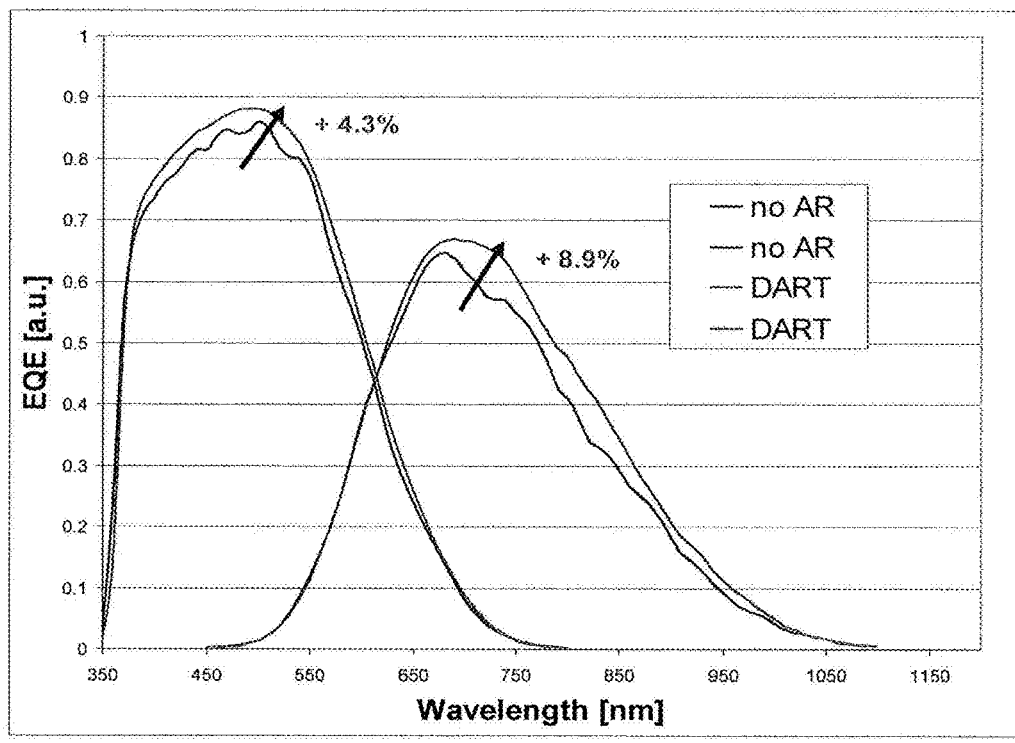
FIG. 14 shows the External Quantum Efficiency EQE curve measured for a tandem micromorph cell without (no AR, lower curves) and with DART treatment (120 min, upper curves). A gain in $J_{SC}$ superior to the expected 4% in the top a-Si:H cell and in the microcrystalline bottom cell indicates a contribution to increased light-trapping from the DART treatment.

FIG. 14: External Quantum Efficiency (EQE) curve measured for a tandem micromorph cell without (no AR, lower curves) and with DART treatment (120 min, upper curves).

FIG. 15: Standard AM1.5 I(V) curves of three contacted test cells.

FIG. 16: Transmission electron micrograph of a cross-section of a a-Si:H pin solar cell deposited by PECVD.

FIG. 17: Sketch of a simple equivalent electrical circuit for a thin-film silicon solar cell on a rough substrate exhibiting leaking boundaries.

FIG. 18 shows the effect of the leaking boundaries density on the dark current density $J_{02}$ of microcrystalline silicon solar cells.

FIG. 19 shows the effect of ozone exposure time on the yield of pin devices with two different TCO front types.

The above-described embodiments are meant as examples and shall not confine the invention.

VI. REFERENCES

[1] J. M. Woodcock, H. Schade, H. Maurus, B. Dimmler, J. Springer, A. Ricaud, Proceedings of 14th European Photovoltaic Solar Energy Conference, (1997) 857.

[2] M. A. Green, Proceedings of the 3rd World Conference on Photovoltaic Energy Conversion, paper OPL-02, 2003.

[3] K. Zweibel, B. van Roedern, H. Ullal, Photon International October 2004, 48.

[4] F. Finger, P. Hapke, M. Luysberg, R. Carius, H. Wagner, Appl. Phys. Lett. 65(20), (1994) 2588.

[5] H. Takatsuka, M. Noda, Y. Yonekura, Y. Takeuchi, Y. Yamauchi, Solar Energy 77, (2004) 951.

[6] T. Matsui, A. Matsuda, M. Kondo, Mat. Res. Symp. Proc. 88, (2004) A8.1.1

[7] S. Benagli et al., J. Meier et al., in Proc. of 22nd & 23rd E-PVSEC.

[8] S. Benagli et al., to be publ. in Proc. of 24th E-PVSEC (Hamburg).

[9] L. Castens et al., to be publ. Physics Procedia (E-MRS 2009 spring meeting).

[10] J. Bailat et al., Techn. Digest of PVSEC-18 (Kolkata, India, 2009).

[11] see press release of Oerlikon Solar of May 27, 2009. www.Oerlikon/Solar.com

[12] O. Kluth et al., to be publ. in Proc. of 24th E-PVSEC (Hamburg), paper 3AV.2.47.

[13] K. Neubeck, N. Papathanasiou, R. Sillmann, H. Goldbach, J. Henz, M. Norrington, to be publ. in Proc. of 24th E-PVSEC (Hamburg), paper 3CO.12.2.

What is claimed is:

1. A method for manufacturing a micromorph tandem cell including a substrate/p-i-n junction configuration having a glass/air interface and comprising a μc-Si:H bottom cell and an a-Si:H top cell, an LPCVD ZnO front contact layer and a ZnO back contact in combination with a white reflector, comprising steps of
    applying an AR—Anti-Reflecting—concept to the micromorph tandem cell by DART-etching a glass surface of said air/glass interface to provide antireflection (AR) at the air/glass interface and for a desired light scattering ability (D); and
    implementing an intermediate reflector in the micromorph tandem cell.

2. The method according to claim 1, wherein at least one of the following applies:
    the amorphous and the microcrystalline silicon is deposited by means of PECVD at an excitation energy of 40.68 MHz;
    the amorphous and the microcrystalline silicon is deposited by means of a KAI-M reactor;
    the micromorph tandem cell has a stabilized efficiency of 10.6%;
    the microcrystalline bottom cell has a thickness of 0.8μm;
    the total silicon absorber layer of top and bottom cell is about 1μm thick;
    the intermediate reflector has a refractive index of 1.68.

3. The method of claim 1, wherein etching is performed during a first time span to provide for antireflection ability (AR) and performing said etching additionally during a second time span selected to additionally (AR+D) provide for an increased amount of light scattering.

4. The method of claim 3, further comprising a step of performing laser patterning through said glass/air interface only before performing said etching during said second time span.

5. The method of claim 1, comprising at least one of the following features:
    the glass-substrate/p-i-n junction configuration includes a first electrode, one or more semiconductor thin-film p-i-n or n-i-p junctions, and a second electrode, which are successively stacked on the substrate, in particular said LPCVD ZnO front contact layer, said μc-Si:H bottom cell, said a-Si:H top cell and said ZnO back contact, successively stacked on the substrate;
    the glass-substrate/p-i-n junction configuration includes a transparent substrate of glass with a layer of a transparent conductive oxide deposited thereon, in particular with said LPCVD ZnO front contact layer deposited thereon;
    Antireflex and scattering ability is established by etching after providing said glass- substrate/p-i-n junction configuration.

6. The method of claim 1, wherein said etching is performed by Reactive Ion Etching.

7. The method of claim 1, comprising a step of protecting said p-i-n junction configuration, and in particular said a-Si:H top cell, from the etching of said glass surface by
   temporary mechanical means; or by
   a removable adhesive film or a removable paint.

8. The method according to claim 1, wherein the micromorph tandem cell comprises:
   a substrate and
   a first electrode, in particular said LPCVD ZnO front contact layer, one or more semiconductor thin-film p-i-n or n-i-p junctions, in particular said µc-Si:H bottom cell and said a-Si:H top cell, and a second electrode, in particular said ZnO back contact, successively stacked on said substrate, wherein one of the one or more the p-i-n junctions and the substrate define the substrate/p-i-n junction configuration;
wherein the method comprises:
   Providing said substrate and said first electrode and said at least one junction stacked on said substrate,
   Subjecting the surface of said junction to a controlled oxidation so as to deactivate leaking boundaries through said at least one junction, and
   Applying directly or indirectly said second electrode above said surface that has been subjected to said oxidation.

9. The method of claim 8, wherein said micromorph tandem cell has at least one of the following features:
   Is a thin-film solar cell,
   Is a thin-film silicon solar cell,
   Said surface is a surface of the last deposited thin film silicon layer,
   Said substrate is transparent,
   Said first electrode comprises or is of a transparent conductive oxide deposited on said substrate,
   Said at least one junction comprises hydrogenated microcrystalline or amorphous silicon or a combination thereof,
   The thickness of the i-layer of said at least one junction is below 200nm and the thickness of the p layer is below 10nm,
   Said surface is the surface of an n-layer,
   Said second electrode is deposited at a temperature of about 200° C.,
   Said first electrode comprises or is of a transparent conductive oxide deposited on said substrate.

10. The method of claim 8, wherein said surface
   is exposed to an atmosphere enriched with H2O and/or 30% H2O2 for about 1 h to 2 h at a temperature of about 100° C., or
   is exposed to ozone at room temperature for about 1 hour, or
   is exposed to ozone at a temperature of about 100° C., for about 5 min. to 15 min, Or
   is exposed to ozone at a pressure of 0.5 mbar for 15 min, or
   is exposed to an oxidizing plasma at a power of about 300 mW/cm2 electrode area, at a temperature of about 200° C. for longer than 10 seconds but not longer than one minute.

11. The method of claim 8, wherein said oxidation is performed with an oxidizing agent which accepts electrons being at least one of oxygen, fluorine, sulphur, chlorine, nitrogen.

12. The method of claim 8, wherein said oxidation is performed for at most 5 min.

13. The method according to claim 1, wherein the micromorph tandem cell comprises:
   a substrate,
   upon said substrate a first electrode layer comprising a transparent, conductive oxide, in particular said LPCVD ZnO front contact layer,
   upon said first electrode layer, stacked layers comprising a positively doped semiconductor layer, an intrinsic semiconductor layer and a negatively doped semiconductor layer as well as a second electrode layer, in particular wherein these stacked semiconductor layers are comprised in at least one of said µc-Si:H bottom cell and said a-Si:H top cell, and said second electrode layer in particular is said ZnO back contact;
said method comprising steps of
   providing said substrate,
   depositing upon said substrate said first electrode layer comprising said transparent, conductive oxide and having a surface,
   treating said surface by a first vacuum treatment process during a first time span,
   depositing upon said surface treated by said first vacuum treatment process one of said positively and of said negatively doped layers by a second vacuum process performed during a second time span in a process atmosphere comprising a gaseous dopant,
   performing said first vacuum treatment process in a process atmosphere comprising a gaseous dopant with a different amount than comprised in said atmosphere of said second vacuum process; alternatively, performing said first vacuum treatment process equally to said second vacuum process and selecting said first time span shorter than said second time span.

14. The method of claim 13, comprising performing said first vacuum treatment process as a vacuum plasma treatment process in an atmosphere containing SiH4 and H2 and a gaseous dopant in a concentration between 0% and 80% of the concentration of a gaseous dopant present in the atmosphere of said second vacuum process.

15. The method of claim 13, comprising depositing by said second vacuum process as said one layer a positively doped layer of microcrystalline hydrogenated silicon, thereby performing said second vacuum process suitable for microcrystalline material deposition and performing said first vacuum treatment process in an atmosphere without gaseous dopant.

16. The method of claim 13, wherein said second vacuum process is a vacuum plasma process.

17. The method of claim 13, wherein said first time span is selected to be between 5% and 20% of the sum of the first and second time spans, and wherein preferably said second vacuum process is a vacuum plasma process, and there is valid at least one of:
   said one doped semiconductor layer deposited by said second vacuum process is said positively doped semiconductor layer,
   said one doped semiconductor layer is deposited in an atmosphere comprising a SiH4 to H2 concentration of 0.1% to 10%,
   said one doped semiconductor layer is deposited in an atmosphere comprising SiH4 and the dopant to SiH4 concentration in said atmosphere is 0.1% to 10%,
   said one doped semiconductor layer is deposited at a power density of 10mW/cm2 to 1 W/cm2,
   said one doped semiconductor layer is deposited at a total pressure of 0.5 mbar to 12 mbar,
   said one doped semiconductor layer is deposited at a process temperature between 1500° C. and 2800° C.,
   said one doped semiconductor layer is deposited with an Rf power at a frequency of 13.56 MHz to 82 MHz.

18. The method according to claim 1, wherein said micromorph tandem cell is a thin-film solar cell.

\* \* \* \* \*